(12) United States Patent
Suvarna et al.

(10) Patent No.: US 10,347,745 B2
(45) Date of Patent: Jul. 9, 2019

(54) METHODS OF FORMING BOTTOM AND TOP SOURCE/DRAIN REGIONS ON A VERTICAL TRANSISTOR DEVICE

(71) Applicant: GLOBALFOUNDRIES Inc., Grand Cayman (KY)

(72) Inventors: Puneet Harischandra Suvarna, Menands, NY (US); Steven J. Bentley, Menands, NY (US); Daniel Chanemougame, Troy, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 3 days.

(21) Appl. No.: 15/268,751

(22) Filed: Sep. 19, 2016

(65) Prior Publication Data

US 2018/0083121 A1    Mar. 22, 2018

(51) Int. Cl.
| H01L 29/66 | (2006.01) |
| H01L 21/00 | (2006.01) |
| H01L 29/08 | (2006.01) |
| H01L 29/165 | (2006.01) |

(52) U.S. Cl.
CPC .... H01L 29/66666 (2013.01); *H01L 29/0847* (2013.01); *H01L 29/165* (2013.01)

(58) Field of Classification Search
CPC ....... H01L 27/11; H01L 21/768; H01L 29/66; H01L 29/78; H01L 23/528
See application file for complete search history.

(56) References Cited

U.S. PATENT DOCUMENTS

| 5,342,797 A | 8/1994 | Sapp et al. |
| 5,414,289 A | 5/1995 | Fitch et al. |
| 6,372,559 B1 | 4/2002 | Crowder et al. |
| 6,686,604 B2 | 2/2004 | Layman et al. |
| 6,690,040 B2 | 2/2004 | Chaudhry et al. |
| 6,759,730 B2 | 7/2004 | Chaudhry et al. |
| 7,241,655 B2 | 7/2007 | Tang et al. |
| 7,465,622 B2 | 12/2008 | Lin |
| 7,666,733 B2 | 2/2010 | Delconibus |
| 7,700,432 B2 | 4/2010 | Chaudhry et al. |

(Continued)

FOREIGN PATENT DOCUMENTS

TW    201633530 A    9/2016

OTHER PUBLICATIONS

Hergenrother et al., "The Vertical Replacement-Gate (VRG) MOSFET: A 50-nm Vertical MOSFET with Lithography-Independent Gate Length," IEDM 99-75, IEEE 1999.

(Continued)

*Primary Examiner* — Charles D Garber
*Assistant Examiner* — Abdulfattah B Mustapha
(74) *Attorney, Agent, or Firm* — Amerson Law Firm, PLLC (57) ABSTRACT

One illustrative method disclosed herein includes, among other things, forming a vertically oriented channel semiconductor structure above a substrate, performing an epi deposition process to simultaneously form at least a portion of a bottom source/drain region and at least a portion of a top source/drain region during the epi deposition process and, after performing the epi deposition process, forming a gate structure around a portion of the vertically oriented channel semiconductor structure.

17 Claims, 7 Drawing Sheets

(56) References Cited

U.S. PATENT DOCUMENTS

| | | |
|---|---|---|
| 8,637,849 B2 | 1/2014 | Deligianni et al. |
| 9,177,785 B1 | 11/2015 | Kelly et al. |
| 9,224,840 B2 | 12/2015 | Flachowsky et al. |
| 9,278,362 B2 | 3/2016 | Basu et al. |
| 9,368,619 B2 | 6/2016 | Colinge et al. |
| 9,385,195 B1 | 7/2016 | Zhang |
| 9,660,028 B1 | 5/2017 | Cheng et al. |
| 2003/0047749 A1 | 3/2003 | Chaudhry et al. |
| 2003/0119237 A1 | 6/2003 | Chittipeddi et al. |
| 2007/0111414 A1 | 5/2007 | Chaudhry et al. |
| 2008/0054350 A1 | 3/2008 | Breitwisch et al. |
| 2009/0085088 A1 | 4/2009 | Takaishi |
| 2010/0171163 A1 | 7/2010 | Kim et al. |
| 2011/0253981 A1 | 10/2011 | Rooyackers et al. |
| 2013/0341270 A1 | 12/2013 | Kar et al. |
| 2014/0353593 A1 | 12/2014 | Smets |
| 2015/0091100 A1 | 4/2015 | Xie et al. |
| 2015/0137271 A1 | 5/2015 | Cai et al. |
| 2016/0005850 A1* | 1/2016 | Zhao .................. H01L 29/781 257/329 |
| 2016/0284712 A1* | 9/2016 | Liaw .................. H01L 27/1104 |
| 2017/0229472 A1 | 8/2017 | Lu et al. |
| 2017/0338334 A1* | 11/2017 | Cheng .................. H01L 29/785 |

OTHER PUBLICATIONS

Notice of Allowance from related U.S. Appl. No. 15/097,574 dated Sep. 14, 2016.
Notice of Allowance from related U.S. Appl. No. 15/097,621 dated Sep. 19, 2016.
Notice of Allowance from related U.S. Appl. No. 15/132,383 dated Jul. 21, 2017.
Office Action from related U.S. Appl. No. 15/268,796 dated Jan. 12, 2018.
Translation of Taiwan Office Action from Taiwan application No. 106120573 dated Aug. 28, 2018.

* cited by examiner

Figure 1

(Prior Art)

METHODS OF FORMING BOTTOM AND TOP SOURCE/DRAIN REGIONS ON A VERTICAL TRANSISTOR DEVICE

BACKGROUND OF THE INVENTION

1. Field of the Invention

Generally, the present disclosure relates to the manufacture of semiconductor devices, and, more specifically, to various novel methods of forming bottom and top source/drain regions on a vertical transistor device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, vertical transistors, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

Figure 1:
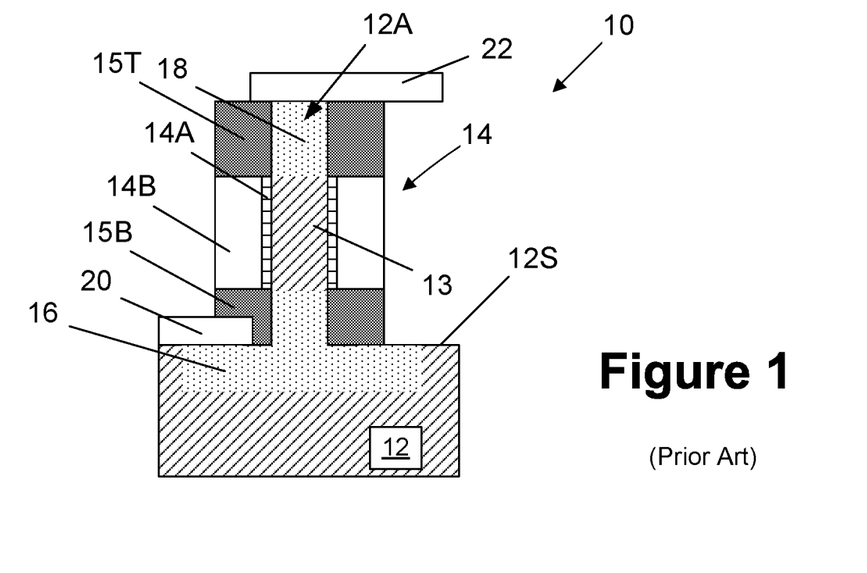
FIG. 1 simplistically depicts an illustrative prior art vertical transistor device.

FIG. 1 is a simplistic depiction of an illustrative prior art vertical transistor device 10. In general, the vertical transistor 10 comprises a generally vertically oriented channel semiconductor structure 12A that extends upward from a front surface 12S of a semiconductor substrate 12. The semiconductor structure 12A may have a variety of different configurations when viewed from above, e.g., circular, rectangular, square, etc. The device 10 further comprises a channel region 13, a gate-all-around (GAA) gate structure 14, a bottom source/drain (S/D) region 16, a top S/D region 18, a bottom spacer 15B and a top spacer 15T. Also depicted is an illustrative bottom contact 20 that is conductively coupled to the bottom S/D region 16 and a top contact 22 that is conductively coupled to the top S/D region 18. In the depicted example, the gate structure 14 comprises a gate insulation layer 14A and a conductive gate electrode 14B. The materials of construction for the components of the device 10 may vary depending upon the particular application. The gate structure 14 may be manufactured using well-known gate first or replacement gate manufacturing techniques.

Device designers and manufacturers are constantly in search of device designs and methods of manufacturing that improve device performance, processing efficiencies and/or product yields. The present disclosure is directed to methods of forming bottom and top source/drain regions on a vertical transistor device that may provide for improved vertical transistor devices that may be manufactured at reduced cost.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming bottom and top source/drain regions on a vertical transistor device. One illustrative method disclosed herein includes, among other things, forming a vertically oriented channel semiconductor structure above a substrate, performing an epi deposition process to simultaneously form at least a portion of a bottom source/drain region and at least a portion of a top source/drain region during the epi deposition process and, after performing the epi deposition process, forming a gate structure around a portion of the vertically oriented channel semiconductor structure.

Another illustrative method disclosed herein for forming a vertical transistor device includes, among other things, forming a vertically oriented channel semiconductor structure above a substrate, performing an epi deposition process to simultaneously form at least a portion of the bottom source/drain region and at least a portion of a top source/drain region during the epi deposition process and forming a bottom spacer around a portion of the vertically oriented channel semiconductor structure and above the bottom source/drain region. In this example, the method also includes forming a gate structure around a portion of the vertically oriented channel semiconductor structure and above the bottom spacer and forming a top spacer around a portion of the vertically oriented channel semiconductor structure and above an upper surface of the gate structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. To the extent the term "adjacent" is used herein and in the attached claims to described a positional relationship between two components or structures, that term should be understood and construed so as to cover situations where there is actual physical contact between the two components and to cover situations where such components are positioned near one another but there is no physical contact between the two components. Physical contact between two components will be specified within the specification and claims by use of the phrase "on and in contact with" or other similar language. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the vertical transistor device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

Figure 2:
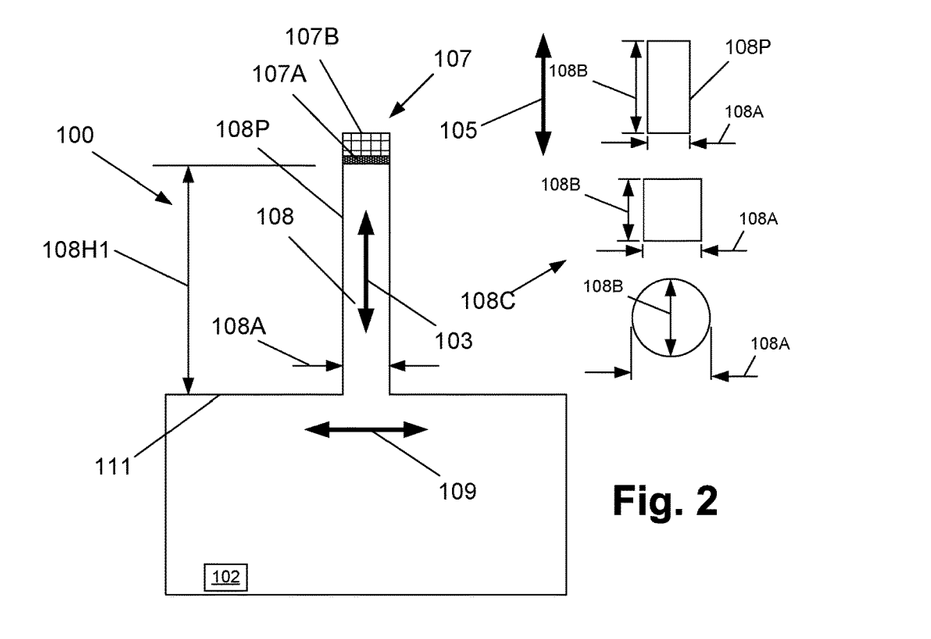
FIGS. 2-13 depict various illustrative novel methods disclosed herein for forming bottom and top source/drain regions on a vertical transistor device.

FIGS. 2-13 depict various illustrative novel methods disclosed herein for forming bottom and top source/drain regions on a vertical transistor device 100. FIG. 2 depicts one illustrative embodiment of a vertical transistor device 100 disclosed herein at an early stage of fabrication wherein several process operations have already been performed. In general, the device 100 will be formed in and above a substrate 102. The substrate 102 may have a variety of configurations, such as the depicted bulk silicon configuration. The substrate 102 may also have a semiconductor-on-insulator (SOI) or a silicon-on-insulator configuration that includes a bulk silicon layer, a buried insulation layer (silicon dioxide) and an active layer (silicon), wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

With continuing reference to FIG. 2, an initial vertically oriented channel semiconductor structure 108 has been formed for the transistor device 100. The initial vertically oriented channel semiconductor structure 108 may be formed using any of a variety of known techniques and it may have a variety of different configurations 108C when viewed from above, e.g., circular, square, rectangular, etc., as indicated in FIG. 2, and an outer perimeter 108P. During operation, current will flow through the device 100 in the direction indicated by the double arrows 103, which is the gate length direction of the device 100. The gate width direction 105 of the device 100, i.e., into and out of the plane of the drawing, is also depicted in FIG. 2. When viewed in the cross-section shown in the figures herein, the initial vertically oriented channel semiconductor structure 108 has a lateral width 108A in a cross-fin direction 109 and a lateral width 108B (see simplistic configurations 108C) in the gate width direction 105. The cross-fin direction 109 is normal to both the gate length 103 and gate width 105 directions. The dimensions 108A and 108B may vary depending upon the particular application and the dimensions 108A and 108B may be the same or different depending upon the configuration 108C of the vertically oriented channel semiconductor structure 108. In the depicted example, the initial vertically oriented channel semiconductor structure 108 was defined by performing one or more etching processes through a patterned etch mask 107 so as to define an initial trench 111 in the substrate 102. The initial vertically oriented channel semiconductor structure 108 has a first or initial height 108H1. The patterned etch mask 107 may be comprised of one or more layers of material and it may be formed by performing one or more layers of material and thereafter patterning those materials using known photolithography and etching techniques. In one illustrative embodiment, the patterned etch mask 107 may be comprised of a layer of silicon dioxide 107A and a layer of silicon nitride 107B. In some applications, the patterned etch mask 107 may be relatively thin, e.g., 1-50 nm.

In the illustrative example depicted in the attached figures, the initial vertically oriented channel semiconductor structure 108 is depicted as having been formed from the same material as the substrate 102. However, in other applications, the initial vertically oriented channel semiconductor structure 108 may be comprised of a semiconductor material that is different than the semiconductor material of the substrate 102. For example, prior to forming the initial vertically oriented channel semiconductor structure 108, a layer of semiconductor materials, such as silicon-germanium, may be formed above the substrate 102. In such a case, when formed, the initial vertically oriented channel semiconductor structure 108 may be comprised entirely or partially of this different semiconductor material. Other techniques may be used to form the initial vertically oriented channel semiconductor structure 108 from a semiconductor material that is different from the semiconductor material of the substrate 102. For ease of explanation, the initial vertically oriented channel semiconductor structure 108 depicted herein will be shown as being formed from the same material as that of the substrate 102.

The initial vertically oriented channel semiconductor structure 108 may be formed using a variety of techniques. In one illustrative example, the initial vertically oriented channel semiconductor structure 108 may be formed initially defining a plurality of fins across the substrate 102 and thereafter cutting the fins in both horizontal directions so as to create an initial vertically oriented channel semiconductor structure 108 having a substantially rectangular, substantially square or a somewhat substantially circular configuration when viewed from above, as shown in FIG. 2. In some cases, the initial vertically oriented channel semiconductor structure 108 may be formed by performing one or more anisotropic etching processes. In other cases, the initial vertically oriented channel semiconductor structure 108 may be formed in such a manner that it has a tapered cross-sectional configuration (wider at the bottom than at the top at this point in the process flow). Thus, the size and configuration of the initial vertically oriented channel semiconductor structure 108 and the manner in which it is made should not be considered a limitation of the present invention.

Figure 3:
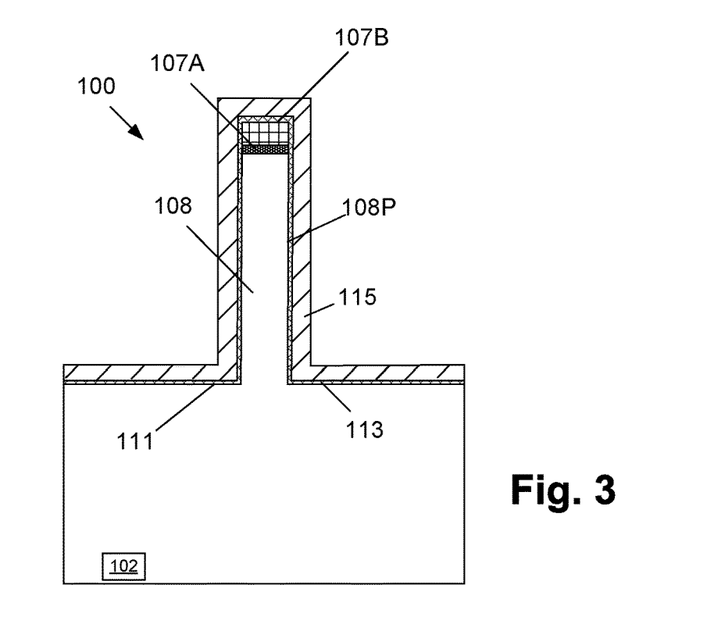
Figure 4:
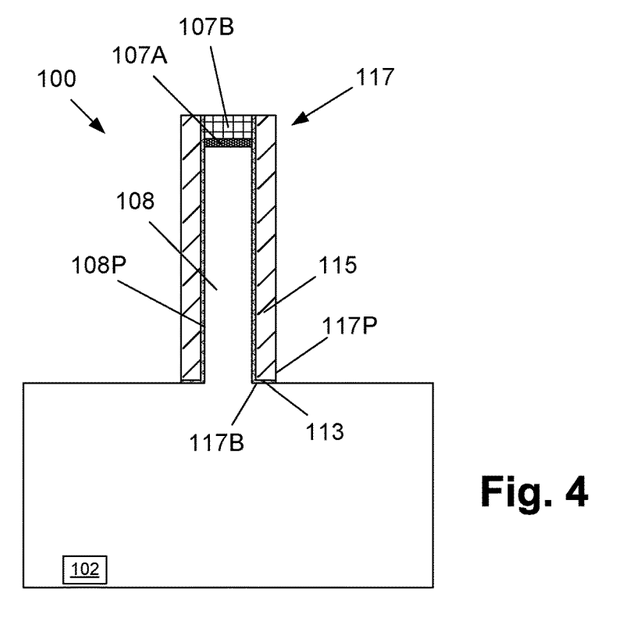

The next major process operation involves forming a spacer structure 117 around the entire outer perimeter 108P of the initial vertically oriented channel semiconductor structure 108, as shown in FIGS. 3 and 4. Accordingly, FIG. 3 depicts the device 100 after a conformal deposition process was performed to form a layer of material 113 (e.g., SiBCN) around the entire outer perimeter 108P of the initial vertically oriented channel semiconductor structure 108 and after another conformal deposition process was performed to form another layer of material 115 (e.g., silicon nitride) on the layer of material 113. The layers 113 and 115 may be formed to any desired thickness. However, as will be appreciated by those skilled in the art after a complete reading of the present application, instead of forming the spacer 117 from two layers of material (113, 115), the spacer 117 may be formed from only a single layer of material in some applications. Additionally, in some applications, the hard mask 107 may be removed prior to the formation of the material(s) for the spacer 117. In the illustrative process flow depicted herein, the spacer 117 will remain in place until later in the process flow.

FIG. 4 depicts the device 100 after a plurality of anisotropic etching processes were sequentially performed on the layers 115, 113 to define the spacer structure 117 around the entire outer perimeter 108P of the initial vertically oriented channel semiconductor structure 108. The outer perimeter 117P of the spacer structure 117 at its base 117B will generally have a configuration that corresponds to the outer perimeter 108P of the initial vertically oriented channel semiconductor structure 108. Of course, as noted above, the spacer structure 117 may be comprised of only a single layer of material or more than the two illustrative layers 113, 115 depicted herein. The lateral width of the spacer structure 117 at the base 117B of the spacer structure 117 (the point where it contacts the initial trenches 111) may vary depending upon the particular application. In one illustrative embodiment, the spacer structure 117 may have a lateral width at the base 117B of the spacer structure 117 that falls within the range of about 1-5 nm. This process operation exposes the hard mask 107 for subsequent removal.

Figure 5:
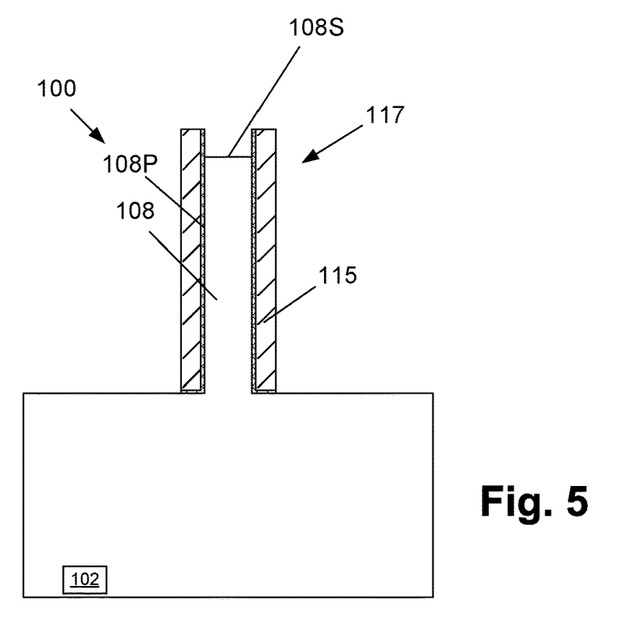

FIG. 5 depicts the device 100 after one or more etching processes were performed to remove the patterned hard mask feature 107 selectively relative to the surrounding materials. The process operation exposes an upper surface 108S of the initial vertically oriented channel semiconductor structure 108. However, as will be appreciated by those skilled in the art after a complete reading of the present application, in other process flows, the patterned mask feature 107 may be not be removed at this point in the manufacturing process.

Figure 6:
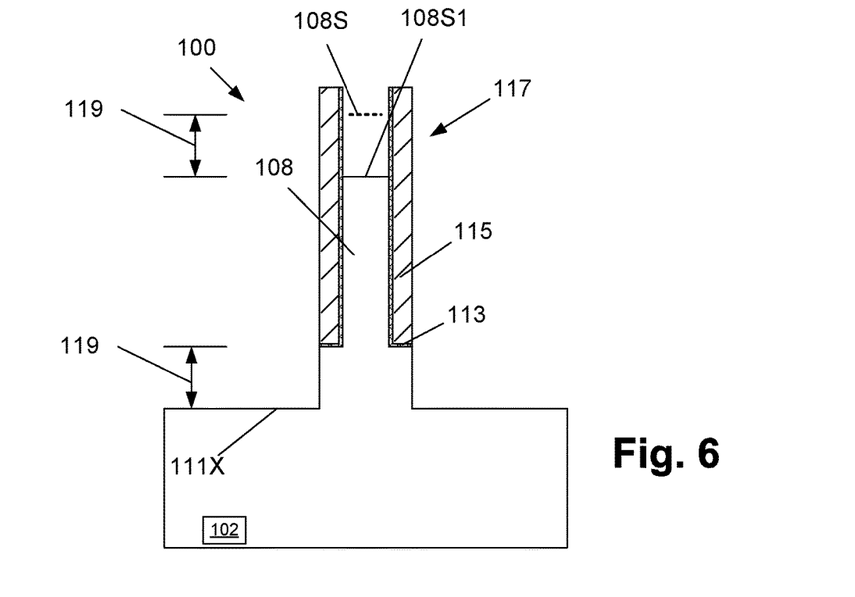

FIG. 6 depicts the device 100 after another anisotropic etching process was performed to extend the depth of the initial trench 111 by a distance 119 and thereby define a deeper trench 111X in the substrate 102. This etching process also removes about the same amount 119 of the initial vertically oriented channel semiconductor structure 108 and results in the vertically oriented channel semiconductor structure 108 having a recessed upper surface 108S1 (surface 108S is shown in a dashed line). Of course, due to etch loading factors, the exact amount of material removed (i.e., as reflected by the distance 119) from the initial vertically oriented channel semiconductor structure 108 may not precisely match the amount of material removed from the initial trenches 111. The distance 119 may vary depending upon the particular application, e.g., 10-50 nm.

Figure 7:
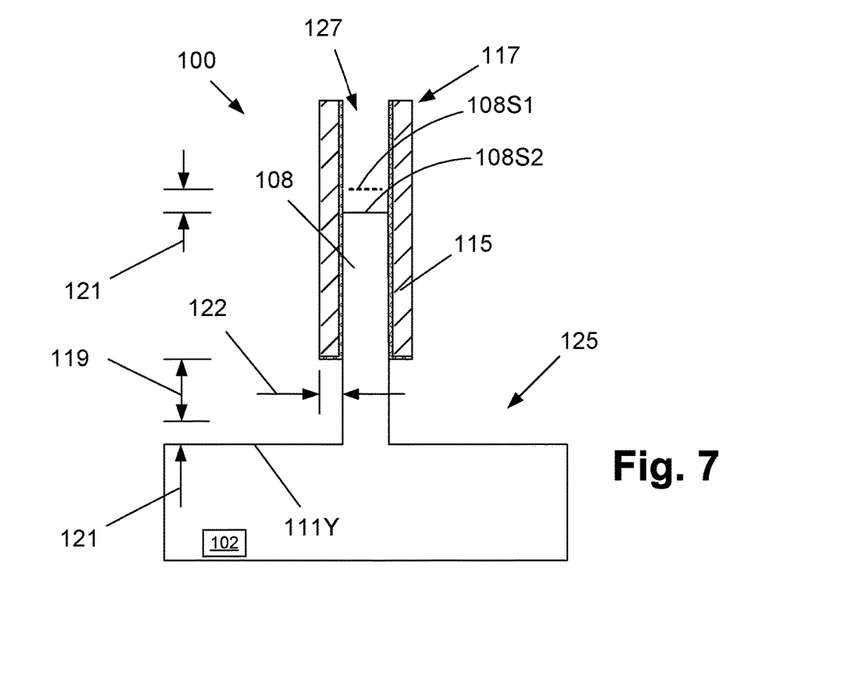

FIG. 7 depicts the device 100 after a timed, isotropic etching process was performed to laterally recess or remove portions of the lower portion of the vertically oriented channel semiconductor 108 not covered by the spacer 117 and to extend the depth of the trench 111X by a distance 121 and thereby define an even deeper trench 111Y in the substrate 102. This etching process also removes about the same amount 121 of the vertically oriented channel semiconductor structure 108 and results in the vertically oriented channel semiconductor structure 108 having a second recessed upper surface 108S2 (recessed surface 108S1 is shown in a dashed line). Of course, due to etch loading factors, the exact amount of material removed (i.e., as reflected by the distance 121) from the vertically oriented channel semiconductor structure 108 may not precisely match the amount of material removed from the trenches 111X. The distance 121 may vary depending upon the particular application, e.g., 2-8 nm. Note that, due to the isotropic nature of the etching process, a lateral portion of the vertically oriented channel semiconductor structure 108 positioned under the spacer 117 is removed, as reflected by the distance 122. In some applications, the etching process may result in the dimension 122 being larger than that depicted in the drawings. However, the lateral aspects of this etching process must be controlled to insure that sufficient material remains to mechanically support the vertically oriented channel semiconductor structure 108 in subsequent process operations. The process operations result in the formation of a bottom source/drain cavity 125, i.e., the trench 111Y, and a top source/drain cavity 127 above the recessed surface 108S2 of the vertically oriented channel semiconductor structure 108.

Figure 8:
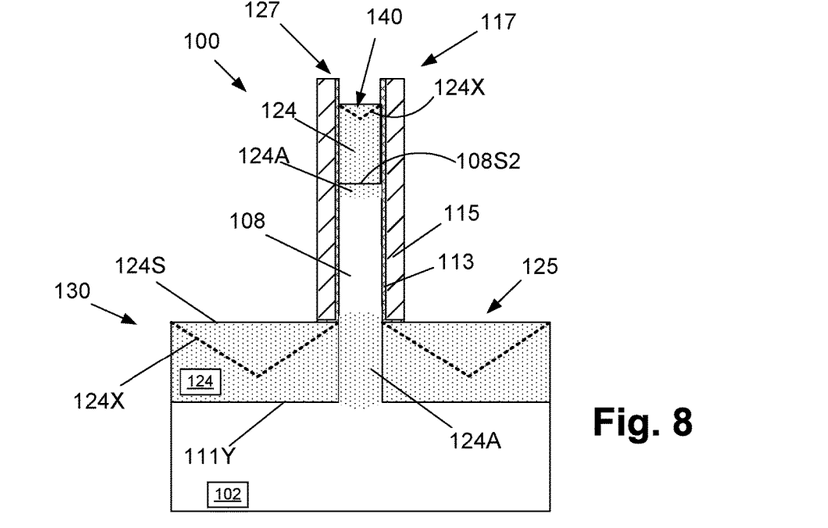

FIG. 8 depicts the device 100 after one illustrative process flow wherein an epitaxial growth process was performed to simultaneously form an epi semiconductor material 124 in both the bottom source/drain cavity 125 and the top source/drain cavity 127. The epi semiconductor material 124 may be comprised of different materials depending upon the type of device under construction, e.g., SiGe for a P-type device, SiC for an N-type device. In the depicted example, the epi material 124 has a simplistically depicted substantially planar upper surface 124S. However, depending upon the material of the epi semiconductor material 124 and the crystalline orientation of the material of the substrate 102, the epi semiconductor material 124 may have a faceted upper surface 124X, as depicted by the dashed lines in FIG.

8. For ease of explanation, the epi semiconductor material 124 will be depicted in subsequent drawings as only having the substantially planar upper surface 124S. The epi semiconductor material 124 may be in situ doped with an appropriate dopant 124A (N-type or P-type depending upon the type of device under construction) during the formation of the epi semiconductor material 124. As depicted, during the epi deposition process and/or during a heat treatment process performed after the epi material 124 is formed, dopants 124A may migrate laterally into the lower portion of the vertically oriented channel semiconductor structure 108 adjacent the trench 111Y, as well as possibly upward into the lower portion of the vertically oriented channel semiconductor structure 108, and downward into the upper portion of the vertically oriented channel semiconductor structure 108 just below the second recessed upper surface 108S2. This process operation results in the simultaneous formation of a bottom source/drain region 130 for the device 100 in the bottom source/drain cavity 125 and a top source/drain region 140 for the device 100 in the top source/drain cavity 127. By simultaneously forming the epi material 124 for both the bottom source/drain region 130 and the top source/drain region 140, both of these regions 130, 140 will have similar junction gradient performance, thereby leading to better control of gate overlap and hence more uniform device performance. In some cases, the regions 130, 140 may have substantially the same thickness in the vertical direction. Of course, due to a variety of factors, such as deposition loading effects, the thickness of the bottom source/drain region 130 and the top source/drain region 140 might not precisely match one another. Nevertheless, by forming the bottom source/drain region 130 and the top source/drain region 140 at the same time, these two regions 130, 140 should exhibit improved junction uniformity (relative to each other) as compared to top and bottom source/drain regions formed on vertical transistor devices using various prior art processing techniques where the top and bottom source/drain regions were formed by performing separate epi deposition processes at different times in the process flow.

In an alternative process flow, rather than remove the patterned etch mask 107 as shown in FIG. 5, the patterned etch mask 107 may be left in place. Thereafter, the process depicted in FIG. 6 may be performed to form the trench 111X while the vertically oriented channel semiconductor structure 108 remains protected by the etch mask 107. In this example, there would be no recessing of the vertically oriented channel semiconductor structure 108. Thereafter, the isotropic etching process depicted in FIG. 7 may be performed to form the deeper trench 111Y and to laterally etch under the spacer 117. The patterned etch mask 107 would remain in position during this isotropic etching process so that there would be no recessing of the vertically oriented channel semiconductor structure 108. Thereafter, with the patterned etch mask 107 still in position, the epi deposition process can be formed to partially fill the trench 111Y with epi material 124, at which time the epi deposition process may be stopped. At that point, the patterned etch mask 107 may be removed so as to expose the upper surface 108S of the vertically oriented channel semiconductor structure 108. Thereafter, the epi deposition process may be resumed so as to form additional epi material 124 on the epi material previously formed in the trench 111Y and to form epi material on the upper surface 108S of the vertically oriented channel semiconductor structure 108. The net result of this process flow is still the formation of the bottom source/drain region 130 and the top source/drain region 140 wherein a common epi deposition process is performed to simultaneously form at least a portion of both the bottom source/drain region 130 and the top source/drain region 140. This process flow permits the thickness of the top source/drain region 140 and the recessing of the vertically oriented channel semiconductor structure 108 to be controlled independent of the thickness of the bottom source/drain region 130. In this process flow, an upper portion of the bottom source/drain region 130 and the entirety of the top source/drain region 140 would be formed at the same time by performing the second epi deposition process. This may be desirable to optimize junction overlap and gradient.

Figure 9:
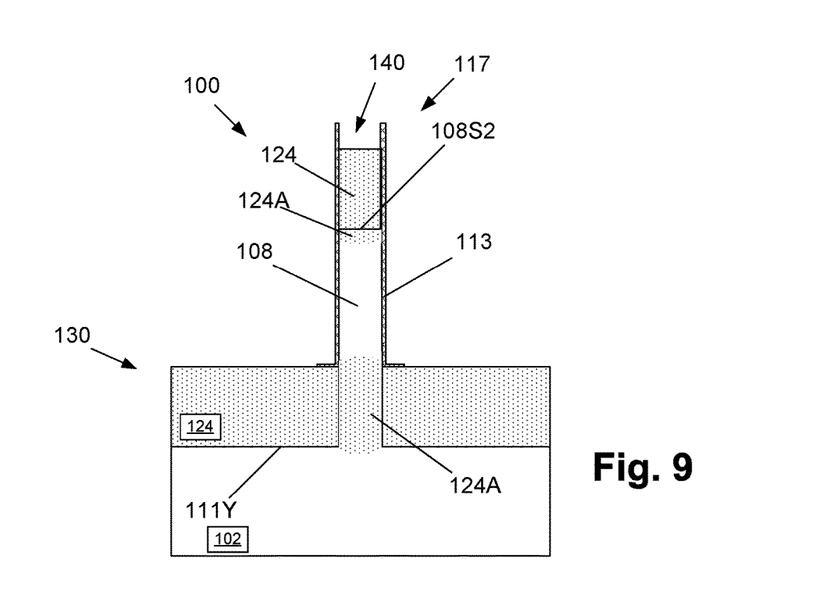

The next major process operation involves removing at least portions of the spacer 117 by performing one or more etching processes. As shown in FIG. 9, in one illustrative process flow, a first etching process may be performed to remove the layer of material 115 selective to the surrounding materials while leaving the layer of material 113 in position.

Figure 10:
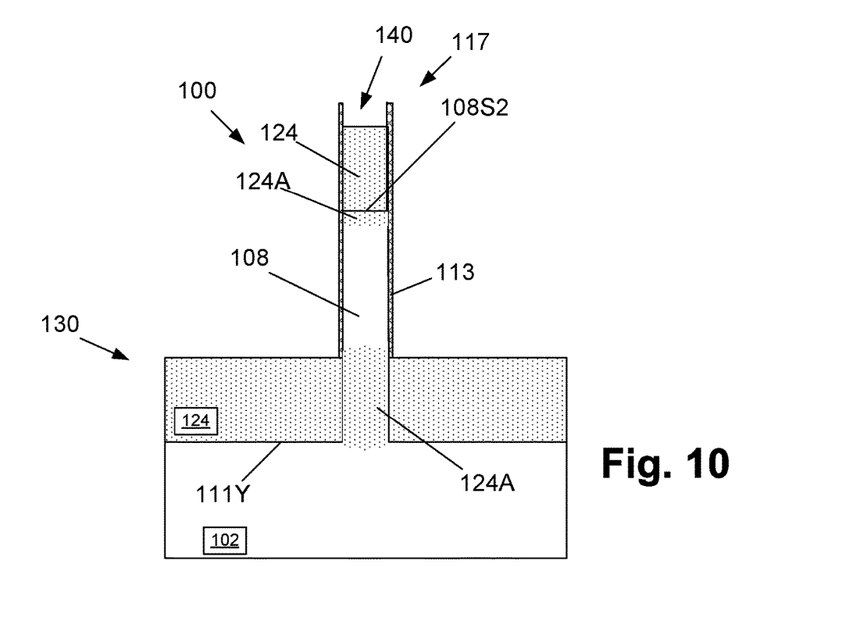

FIG. 10 depicts the device 100 after an anisotropic etching process was performed on the layer of material 113 to remove horizontally positioned portions of the layer of material 113.

Figure 11:
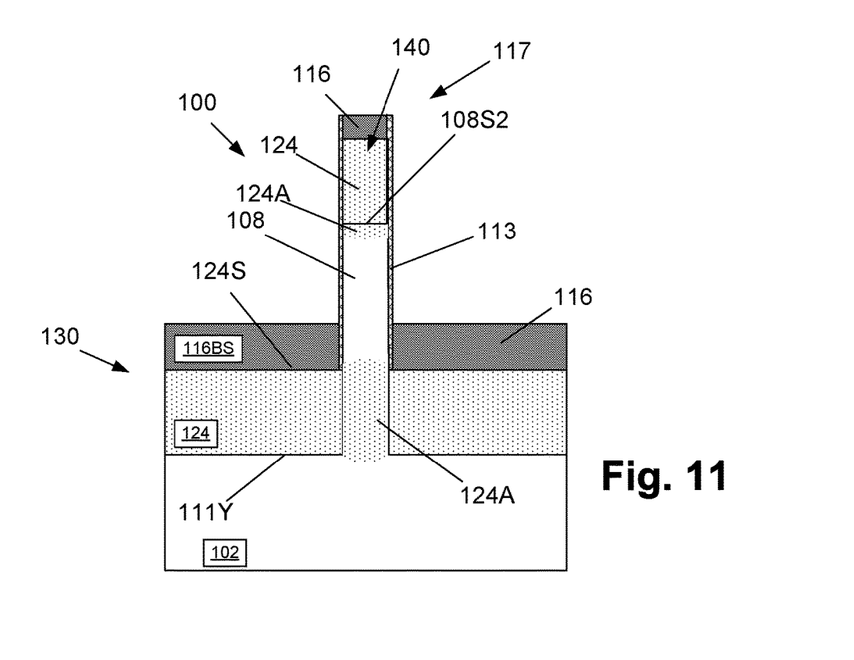

FIG. 11 depicts the device 100 after several process operations were performed. First, a non-conformal deposition process (e.g., anisotropic HDP or PVD) was performed to deposit a layer of bottom spacer material 116 primarily on the horizontally oriented surfaces of the device 100, i.e., primarily on the surface 124S of the bottom source/drain region 130 and on the upper surface of the top source/drain region 140. Thereafter, a brief etching process was performed to remove any portions of the layer of bottom spacer material 116 that was formed on the non-horizontal surfaces of the device 100. This results in the formation of a bottom spacer 116BS for the device and the optional formation of a region of the bottom spacer material 116 above the top source/drain region 140. In other embodiments, the bottom spacer 116BS may be formed using a conformal process, or using multiple sequential techniques. The bottom spacer 116BS may be formed to any desired thickness and it may be made of any desired material, e.g., silicon nitride, a material having a k value of less than about 7, etc. In some applications, the layer of material 113 may be removed entirely prior to the formation of the bottom spacer 116BS.

Figure 12:
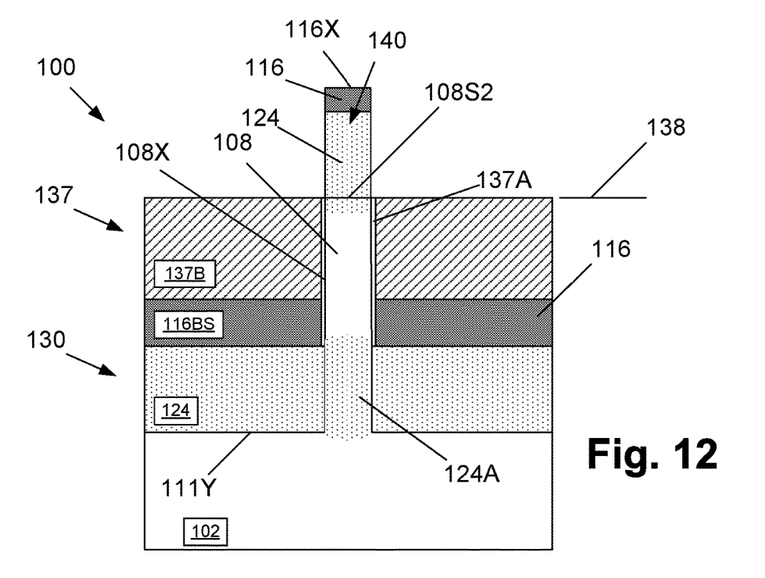

FIG. 12 depicts the device 100 after several process operations were performed. First, an etching process was performed to remove the layer of material 113 selectively relative to the surrounding materials. This process exposes the sidewalls 108X of the vertically oriented channel semiconductor structure 108 and results in the formation of a small space between the bottom spacer 116BS and the lower portion of the vertically oriented channel semiconductor structure 108. Next, various process operations were performed to form an illustrative and simplistically depicted gate structure 137 for the device 100. In general, the gate structure 137 may be comprised of one or more layers of insulating material that serve (in whole or part) as the gate insulation layer for the device 100, and one or more layers of conductive material, e.g., a metal, a metal alloy, polysilicon, a work-function adjusting metal, etc., that function (in whole or part) as the gate electrode of the device 100. In the example depicted herein, the illustrative gate structure 137 comprises an illustrative gate insulation layer 137A and a conductive gate electrode 137B. The thickness and composition of the materials for the gate structure 137 may vary depending upon the particular application, and the relative thickness of the materials for the gate structure 137 shown in the drawings is not to scale. In one illustrative example, the same materials for the gate structure 137 may be used for the gate structure for both N- and P-type devices. In other applications, by formation of appropriate masking layers (not shown), the materials for the gate structure 137 used for N- and P-type devices may be different. In one illustrative embodiment, the layer of insulating material 137A may be made of a high-k (k value of 10 or greater) insulating material, such as hafnium oxide, while the conductive gate electrode 137B may be comprised of a material such as titanium nitride (not separately shown) that functions as a work-function adjusting layer, and a bulk layer of conductive material such as a metal, a metal alloy, tungsten or a doped polysilicon. As will be appreciated by those skilled in the art after a complete reading of the present application, the gate structure 137 is intended to be representative of any type of gate structure that may be formed using any techniques.

One illustrative process flow for forming the gate structure 137 shown in FIG. 12 will now be described. First, a conformal deposition process was formed to form the gate insulation layer 137A around the vertically oriented channel semiconductor structure 108. More specifically, the gate insulation layer 137A was formed on the sidewalls 108X of the vertically oriented channel semiconductor structure 108, in the space between the vertically oriented channel semiconductor structure 108 and the bottom spacer 116BS (the space being formed by the removal of the layer 113) and above the upper surface 116X of the layer of bottom spacer material 116 positioned above the top source/drain region 140. Thereafter, one or more deposition processes were performed for depositing the material(s) for the conductive gate electrode 137B on and/or above the gate insulation layer 137A such that they "overfill" the area adjacent the vertically oriented channel semiconductor structure 108. Next, one or more CMP process operations were performed to planarize the upper surfaces of the gate insulation material(s) 137A and the gate electrode material(s) 137B with the upper surface 116X of the layer of bottom spacer material 116 positioned above the top source/drain region 140. This process operation exposes the upper surface 116X. Then, one or more recess etching processes were performed to recess the materials that comprise the layers 137A, 137B to a level indicated by the line 138. As depicted, in this illustrative process flow, the bottom spacer material 116 positioned above the top source/drain region 140 remains in position throughout the process of recessing the materials of the gate structure 137.

Figure 13:
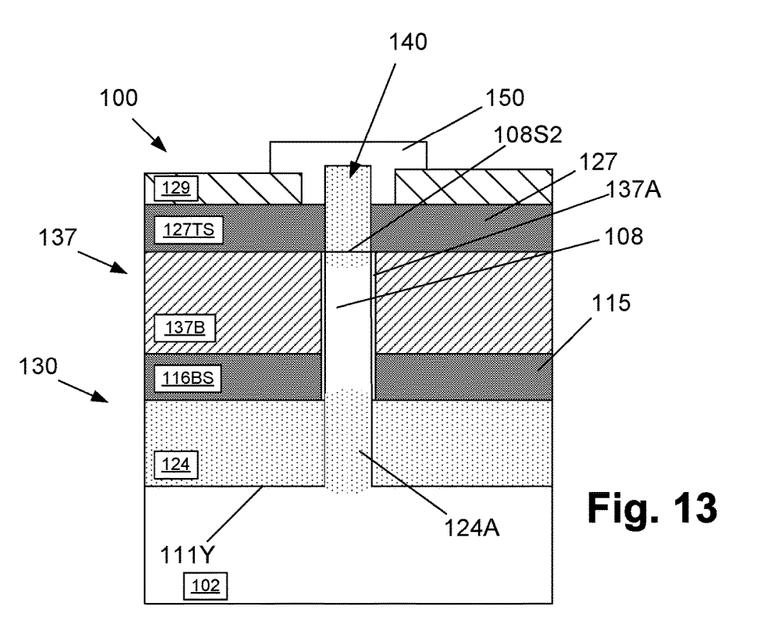

FIG. 13 depicts the device 100 after several process operations were performed. First, a non-conformal deposition process (e.g., anisotropic HDP or PVD) or a standard deposition process was performed to deposit a layer of top spacer material 127 above the gate structure 137. In one embodiment, enough of the top spacer material 127 is deposited such that it has an as-deposited upper surface that is positioned at a level that is above the level of the upper surface 116X of the layer of first spacer material 116 (see FIG. 12). Thereafter, a CMP process may be performed to planarize the upper surface of the layer of top spacer material 127. Next, a recess etching process is performed to remove portions of the layer of top spacer material 127 and thereby result in the formation of a top spacer 127TS adjacent the gate structure 137. This etching process also results in the removal of the portion of the first spacer material 116 that is positioned above the top source/drain region 140. In other embodiments, the top spacer 127TS may be formed using a conformal process, or using multiple deposition techniques. The top spacer 127TS may be formed to any desired thickness and it may be made of any desired material, e.g., silicon nitride, a material having a k value of less than about 7, etc. In some embodiments, the top spacer 127TS and the bottom spacer 116BS may be made of the same material, but that may not be the case in all applications. With continuing reference to FIG. 13, the next process operation involves forming an optional patterned layer of insulating material 129, e.g., silicon dioxide, a low-k material (k value less than 3.5), etc. that exposes a portion of the top source/drain region 140. Next, a simplistically depicted upper S/D contact 150 was formed for the device 100 so as to establish electrical contact to the upper source/drain region 140. In one illustrative process flow, the upper S/D contact 150 was formed by depositing an appropriate contact metal, such as tungsten, and thereafter patterning that layer of contact metal. Additionally, although not separately depicted, a metal silicide layer (not shown) may be formed on the exposed portions of the upper source/drain region 140 prior to depositing the contact metal. It should also be noted that a conductive contact to the gate structure 137 and the bottom source/drain region 130 may be formed at or near the same time that the upper S/D contact 150 is formed, but the gate contact structure and the bottom source/drain contact structure are not depicted in FIG. 13.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a vertical transistor device, the method comprising:
   forming a vertically oriented channel semiconductor structure above a substrate;
   performing an epi deposition process to simultaneously form at least a portion of a bottom source/drain region and at least a portion of a top source/drain region during said epi deposition process; and
   after performing said epi deposition process, forming a gate structure around a portion of said vertically oriented channel semiconductor structure positioned vertically between said bottom source/drain region and said top source/drain region.

2. The method of claim 1, wherein performing said epi deposition process comprises performing said epi deposition process to simultaneously form an entirety of said bottom source/drain region and an entirety of said top source/drain region during said epi deposition process.

3. The method of claim 1, wherein performing said epi deposition process comprises performing said epi deposition process to simultaneously form an upper portion of said bottom source/drain region and an entirety of said top source/drain region during said epi deposition process.

4. The method of claim 1, wherein said vertically oriented channel semiconductor structure and said substrate comprise different semiconductor materials.

5. The method of claim 1, wherein forming said vertically oriented channel semiconductor structure above said substrate comprises performing at least one etching process on said substrate to define said vertically oriented channel semiconductor structure, wherein said vertically oriented channel semiconductor structure is comprised of the substrate material.

6. The method of claim 1, wherein, after performing said epi deposition process and prior to forming said gate structure, the method further comprises forming a bottom spacer around a portion of said vertically oriented channel semiconductor structure and above said bottom source/drain region, wherein said gate structure is formed above said bottom spacer structure.

7. The method of claim 6, further comprising forming a top spacer around a portion of said vertically oriented channel semiconductor structure and above said gate structure.

8. The method of claim 1, wherein, prior to performing said epi deposition process, the method comprises etching a trench into said substrate around said vertically oriented channel semiconductor structure, wherein said at least a portion of said bottom source/drain region is formed in said trench.

9. The method of claim 1, wherein performing said epi deposition process comprises performing said epi deposition process to simultaneously form said at least a portion of said bottom source/drain region and said at least a portion of said top source/drain region to substantially a same thickness.

10. A method of forming a vertical transistor device, the method comprising:
    forming a vertically oriented channel semiconductor structure above a substrate;
    performing an epi deposition process to simultaneously form at least a portion of a bottom source/drain region and at least a portion of a top source/drain region during said epi deposition process;
    forming a bottom spacer around a portion of said vertically oriented channel semiconductor structure and above said bottom source/drain region;
    forming a gate structure around a portion of said vertically oriented channel semiconductor structure and above said bottom spacer, wherein said portion of said vertically oriented channel semiconductor structure is positioned between said bottom source/drain region and said top source/drain region; and
    forming a top spacer around a portion of said vertically oriented channel semiconductor structure and above an upper surface of said gate structure.

11. The method of claim 10, wherein performing said epi deposition process comprises performing said epi deposition process to simultaneously form an entirety of said bottom source/drain region and an entirety of said top source/drain region during said epi deposition process.

12. The method of claim 10, wherein performing said epi deposition process comprises performing said epi deposition process to simultaneously form an upper portion of said bottom source/drain region and an entirety of said top source/drain region during said epi deposition process.

13. The method of claim 10, wherein, prior to performing said epi deposition process, the method comprises etching a trench into said substrate around said vertically oriented channel semiconductor structure, wherein said at least a portion of said bottom source/drain region is formed in said trench.

14. The method of claim 10, wherein, prior to performing said epi deposition process, the method comprises:
    removing a patterned etch mask from above an upper surface of said vertically oriented channel semiconductor structure;
    performing an anisotropic etching process to define a first trench in said substrate around said vertically oriented channel semiconductor structure and to remove a first portion of said vertically oriented channel semiconductor structure such that said vertically oriented channel semiconductor structure has a first recessed upper surface; and
    performing an isotropic etching process to define a second trench having a greater depth and a greater lateral width than said first trench and to remove a second portion of said vertically oriented channel semiconductor structure such that said vertically oriented channel semiconductor structure has a second recessed upper surface, wherein performing said epi deposition process results in at least a portion of said bottom source/drain region being formed in said second trench and said top source/drain region being formed on said second recessed upper surface of said vertically oriented channel semiconductor structure.

15. The method of claim 10, wherein performing said epi deposition process comprises performing said epi deposition process to simultaneously form said at least a portion of said bottom source/drain region and said at least a portion of said top source/drain region to substantially a same thickness.

16. A method of forming a vertical transistor device, the method comprising:
    forming a vertically oriented channel semiconductor structure above a substrate by performing at least one etching process through a patterned etch mask positioned above said substrate;
    removing a portion of said patterned etch mask positioned above an upper surface of said vertically oriented channel semiconductor structure;
    performing an anisotropic etching process to define a first trench in said substrate around said vertically oriented channel semiconductor structure and to remove a first portion of said vertically oriented channel semiconductor structure such that said vertically oriented channel semiconductor structure has a first recessed upper surface;
    performing an isotropic etching process to define a second trench having a greater depth and a greater lateral width than said first trench and to remove a second portion of said vertically oriented channel semiconductor structure such that said vertically oriented channel semiconductor structure has a second recessed upper surface;
    performing an epi deposition process to simultaneously form an entirety of said bottom source/drain region and an entirety of said top source/drain region during said epi deposition process, wherein at least a portion of said bottom source/drain region is formed in said second trench and said top source/drain region is formed on said second recessed upper surface of said vertically oriented channel semiconductor structure;
    forming a bottom spacer around a portion of said vertically oriented channel semiconductor structure and above said bottom source/drain region;
    forming a gate structure around a portion of said vertically oriented channel semiconductor structure and above said bottom spacer, wherein said portion of said vertically oriented channel semiconductor structure is positioned between said bottom source/drain region and said top source/drain region; and forming a top spacer around a portion of said vertically oriented channel semiconductor structure and above an upper surface of said gate structure.

17. The method of claim 16, further comprising forming an upper source/drain contact that is conductively coupled to said upper source/drain region.

* * * * *